United States Patent
Zhang

(10) Patent No.: US 10,491,114 B1
(45) Date of Patent: Nov. 26, 2019

(54) OUTPUT REGULATED CHARGE PUMP

(71) Applicant: NXP B.V., Eindhoven (NL)

(72) Inventor: Xu Zhang, Chandler, AZ (US)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/229,899

(22) Filed: Dec. 21, 2018

(51) Int. Cl.
| | |
|---|---|
| *G05F 1/10* | (2006.01) |
| *G05F 1/46* | (2006.01) |
| *G05F 3/02* | (2006.01) |
| *H02M 3/04* | (2006.01) |
| *H02M 3/07* | (2006.01) |
| *G05F 1/575* | (2006.01) |
| *H02M 1/14* | (2006.01) |
| *H03K 5/24* | (2006.01) |
| *H02M 1/00* | (2006.01) |

(52) U.S. Cl.
CPC ............ *H02M 3/073* (2013.01); *G05F 1/575* (2013.01); *H02M 1/14* (2013.01); *H03K 5/24* (2013.01); *H02M 2001/0009* (2013.01)

(58) Field of Classification Search
CPC ................... H02M 3/073; H02M 1/14; H02M 2001/0009; H03K 5/24; G05F 1/575
See application file for complete search history.

(56) References Cited

U.S. PATENT DOCUMENTS

| | | | | |
|---|---|---|---|---|
| 6,262,567 B1* | 7/2001 | Bartlett | ................... | G05F 1/465 323/266 |
| 6,300,820 B1* | 10/2001 | Fotouhi | ................... | H02M 3/07 327/536 |
| 7,622,900 B2* | 11/2009 | Komiya | ................... | H02M 3/07 323/266 |
| 7,973,592 B2* | 7/2011 | Pan | ....................... | H02M 3/073 327/536 |
| 8,035,440 B2* | 10/2011 | Hernandez-Garduno | ................... | H02M 3/073 327/535 |
| 8,981,739 B2* | 3/2015 | Zhang | ...................... | G05F 1/56 323/266 |

OTHER PUBLICATIONS

Luo, Z. et al, "Regulated Charge Pump with New Clocking Scheme for Smoothing the Charging Current in Low Voltage CMOS Process", IEEE Transactions on Circuits and Systems I: Regular Papers, vol. 64,No. 3; pp. 528-536. (Mar. 2017).
Ngueya W., et al, "High Voltage Recycling Scheme to Improve Power Consumption of Regulated Charge Pumps", IEEE 27th International Symposium on Power and Timing Modeling, Optimization and Simulation (PATMOS), pp. 1-5. (2017).

* cited by examiner

*Primary Examiner* — Kenneth B Wells

(57) ABSTRACT

An output regulated charge pump including a low drop out (LDO) regulator configured to output a variable first output voltage, a multi-stage charge pump configured to receive the variable first output voltage and produce a second output voltage to power a load, a first feedback circuit configured to compare the second output voltage to a reference voltage, and a second feedback circuit configured to measure level of current used by the load, wherein the second feedback circuit outputs a level select signal to the LDO that is configured to vary a level of the first output voltage and reduce charge pump output ripple.

19 Claims, 4 Drawing Sheets

OUTPUT REGULATED CHARGE PUMP

TECHNICAL FIELD

Example embodiments disclosed herein relate generally to a low ripple regulated charge pump with minimal area for a wide input range.

SUMMARY

A brief summary of various example embodiments is presented below. Some simplifications and omissions may be made in the following summary, which is intended to highlight and introduce some aspects of the various example embodiments, but not to limit the scope of the invention. Detailed descriptions of example embodiments adequate to allow those of ordinary skill in the art to make and use the inventive concepts will follow in later sections.

Example embodiments include an output regulated charge pump including a low drop out (LDO) regulator configured to output a variable first output voltage, a multi-stage charge pump configured to receive the variable first output voltage and produce a second output voltage to power a load, a first feedback circuit configured to compare the second output voltage to a reference voltage; and a second feedback circuit configured to measure level of current used by the load, wherein the second feedback circuit outputs a level select signal to the LDO that is configured to vary a level of the first output voltage and reduce charge pump output ripple.

The first feedback circuit may include a voltage divider, a comparator, and a clock driver. The comparator outputs a signal to control the clock driver. The level select signal is derived from an output signal of the comparator.

The multi-stage charge pump may include at least one pumping stage that outputs higher voltage than its input voltage.

The second feedback circuit may include a current sensing circuit separate from the first feedback circuit.

The reference voltage may be a bandgap voltage.

The level select signal may be a binary signal.

The variable first output voltage may have at least three levels.

The variable first output voltage may cover a continuous range from a minimum level to a maximum level.

Example embodiments also include a method of regulating an output of a charge pump including outputting a first voltage level to a first stage of a multi-stage charge pump, outputting a second voltage level from an output stage of the multi-stage charge pump to power a load, comparing the second voltage level to a reference voltage to determine an average value of the second voltage level, measuring a current level used by the load and inputting a level select signal to the LDO indicative of the current level, and using the level select signal in the LDO to output a variable voltage signal to the multi-stage charge pump to control the second voltage level to be a level commensurate with the load.

The method may include using a first feedback loop to conduct the voltage comparing.

The method may include using a second feedback loop to conduct the current sensing.

The method may include deriving the sensed current from a feedback loop that determines a level of the second output voltage.

The method may include dropping down the second voltage level using a voltage divider, comparing the dropped down voltage to the reference voltage using a comparator, and inputting an output of the compared voltages to a clock driver.

The method may include controlling the clock driver using an output of the comparator. The method may include deriving the level select signal from an output signal of the comparator.

BRIEF DESCRIPTION OF THE DRAWINGS

Additional objects and features of the invention will be more readily apparent from the following detailed description and appended claims when taken in conjunction with the drawings. Although several example embodiments are illustrated and described, like reference numerals identify like parts in each of the figures, in which:

DETAILED DESCRIPTION

Figure 1:
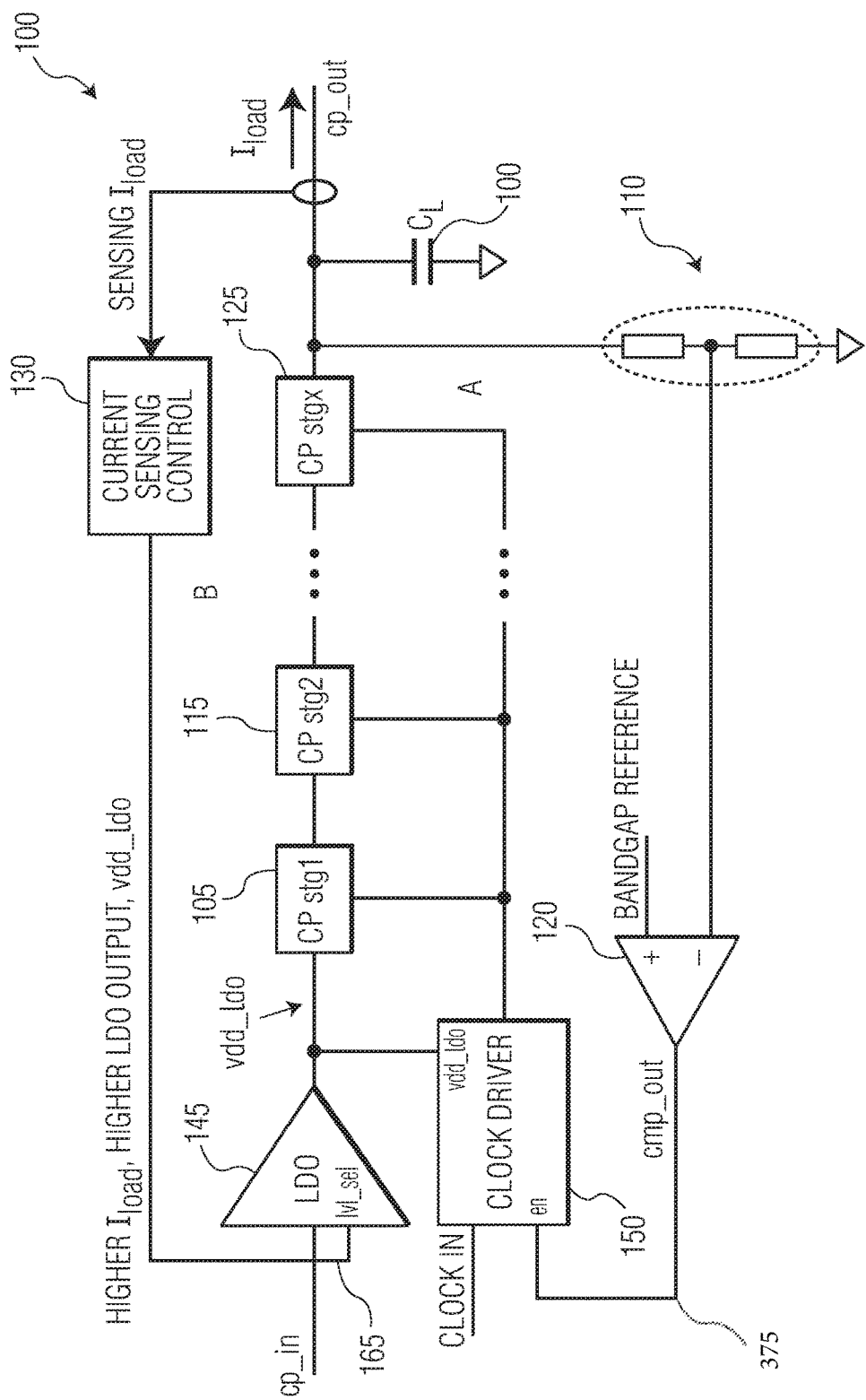
FIG. 1 illustrates an output regulated charge pump with input regulation based on a loading condition in accordance with example embodiments described herein.

It should be understood that the figures are merely schematic and are not drawn to scale. It should also be understood that the same reference numerals are used throughout the figures to indicate the same or similar parts.

The descriptions and drawings illustrate the principles of various example embodiments. It will thus be appreciated that those skilled in the art will be able to devise various arrangements that, although not explicitly described or shown herein, embody the principles of the invention and are included within its scope. Furthermore, all examples recited herein are principally intended expressly to be for pedagogical purposes to aid the reader in understanding the principles of the invention and the concepts contributed by the inventor(s) to furthering the art and are to be construed as being without limitation to such specifically recited examples and conditions. Additionally, the term, "or," as used herein, refers to a non-exclusive or (i.e., and/or), unless otherwise indicated (e.g., "or else" or "or in the alternative"). Also, the various example embodiments described herein are not necessarily mutually exclusive, as some example embodiments can be combined with one or more other example embodiments to form new example embodiments. Descriptors such as "first," "second," "third," etc., are not meant to limit the order of elements discussed, are used to distinguish one element from the next, and are generally interchangeable. Values such as maximum or minimum may be predetermined and set to different values based on the application.

In previous designs, charge pump stages may over-drive an output by using a standard, fixed input voltage. An excessive charge injection at a charge pump output may include an unwanted large ripple effect. The large output ripple could be suppressed by increasing a load capacitor at the output. However, the load capacitor is typically a low density metal fringe capacitor, a type of capacitor that can tolerate the high voltage at the charge pump output. To suppress the ripple, the size of the load capacitor may be increased to a value higher than the rest of the circuit to suppress the ripple to a reasonable level, but such a design is not preferred.

Example embodiments describe an output regulated charge pump configured to produce a low ripple output using an area efficient approach. The output regulated charge pump includes an ability to control voltage regulations at both input and output stages. As a result, the output regulated charge pump may output an accurate voltage over a wide input range with little output ripple. To suppress a high output ripple, an input to a first stage of the charge pump may be regulated based on an output loading condition. Therefore, an excessive charge injection at the output is minimized, as well as an output ripple. Applying this approach, a high voltage and low density load capacitor may be used and have a minimal size, which may optimize a design area.

A closed loop output regulated charge pump (CP) may be used for applications having better output accuracy over an open loop counterpart. Example embodiments include an dual-loop output feedback regulation thats minimizes the output voltage ripple, especially when an input voltage of the charge pump is in a wide range. Example embodiments thus provide an output regulated charge pump configured to minimize the undesired ripple without significant area penalty.

FIG. 1 illustrates an output regulated charge pump 100 with input regulation based on a loading condition in accordance with example embodiments described herein. The output regulated charge pump 100 may include a plurality of charge pump stages including a first charge pump stage 105, a second charge pump stage 115, and a third charge pump stage 125. Though not illustrated, between the second charge pump stage 115 and the third charge pump stage 125 may be any number of intermediate stages configured to pump a voltage level to a higher value in accordance with system requirements. An output of the third charge pump stage 125 may be used to power a load (not illustrated). The output may have voltage and current characterisitcs.

The output regulated charge pump 100 includes a low drop out (LDO) regulator 145 configured to output an initial voltage vdd_ldo to the first charge pump stage 105. Inputs to the LDO regulator 145 include a low voltage supply input cp_in and current sensed feedback information lvl_sel. The low voltage supply cp_in may produce a constant voltage that is further modified by the fed back current level controlled pin, lvl_sel. The output regulated charge pump 100 includes a first feedback loop A and a second feedback loop B. The first feedback loop A includes a resistor divider 110, a feedback comparator 120, and a clock driver 150. The resistor divider 110 is configured to drop down an output voltage of the third charge pump stage 125 to a level suitable for the feedback comparator 120. The feedback comparator 120 compares the output voltage of the third stage using the dropped-down voltage to a bandgap reference to determine a pumping state of the multi-stage charge pump. When the dropped down voltage is lower than the bandgap voltage, the feedback comparator 120 may output a cmp_out signal 375 exhibiting characteristics of the charge pump output voltage, and the output regulated charge pump 100 continues to pump. The cmp_out signal 375 may be filtered and averaged and sent to the clock driver 150, which may use this information to control an operation of the charge pump stages. The clock driver 150 also receives the initial vdd_ldo voltage level as a supply to the clock driver 150. When the bandgap reference voltage is higher than the dropped down voltage, a disable signal is input to a clock driver 150 resulting in the charge pump stages 105, 115, and 125 to stop pumping until a the dropped down voltage is lower than the bandgap voltage.

The secondary feedback loop B may include a current sensing control circuit 130 that is configured to sense a current level used by the loading at a given moment. Depending on the sensed current level of the load, the current sensing control circuit 130 may send a signal lvl_sel to the LDO regulator 145. The signal lvl_sel may be used by the LDO regulator 145 to produce a voltage level vdd_ldo commensurate with the required output loading.

Without the feedback loops A and B, an output of the third charge pump stage 125 may be over-driven to a high voltage in which an open loop output voltage is higher than a closed loop output voltage. The closed loop design in accordance with embodiments described herein degrades the output ripple compared to an open loop counterpart. In the open loop counterpart, a constant voltage is set at an input of a first stage of a charge pump. If an amount of loading changes up or down, there is no way to change the input value of the first charge pump stage. Because the input value to the charge pump is set and constant, if a small load appears at an output to the charge pump, a higher input voltage may cause the output to charge more than required, also to have significant ripple or unwanted charge at the output.

Figure 2:
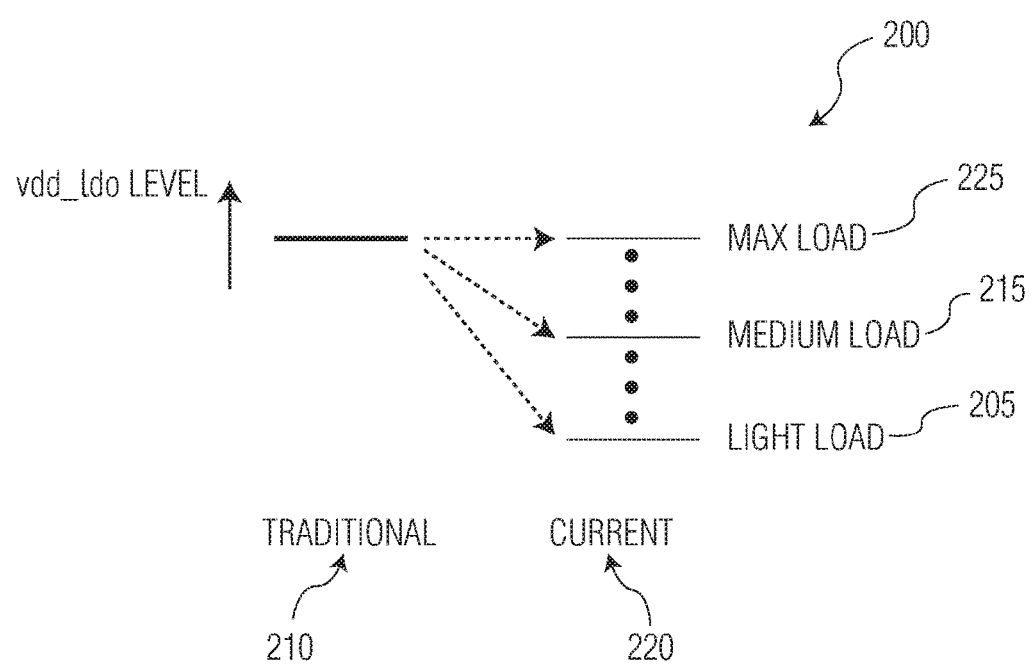
FIG. 2 illustrates an input voltage adjustment scale of the output regulated charge pump in accordance with FIG. 1.

FIG. 2 illustrates an input voltage adjustment scale of the output regulated charge pump 100 in accordance with FIG. 1. Example embodiments minimize an output ripple and reduce an excessive charge injection by adjusting the pump input based on sensed loading conditions using feedback loops A and B. The secondary current sensing loop B is configured to control the input voltage vdd_ldo to the first charge pump stage 105. Compared to a traditional design 210 illustrated in FIG. 2, which has a fixed input for charge pump stages, the current design 220 of example embodiments may regulate the input vdd_ldo to a low level when the output has a light load 205. The input vdd_ldo may be regulated to a medium level when loading at output increases to a medium load 215, and the input is elevated higher when loading an the output increases to an even higher load 225.

Figure 3:
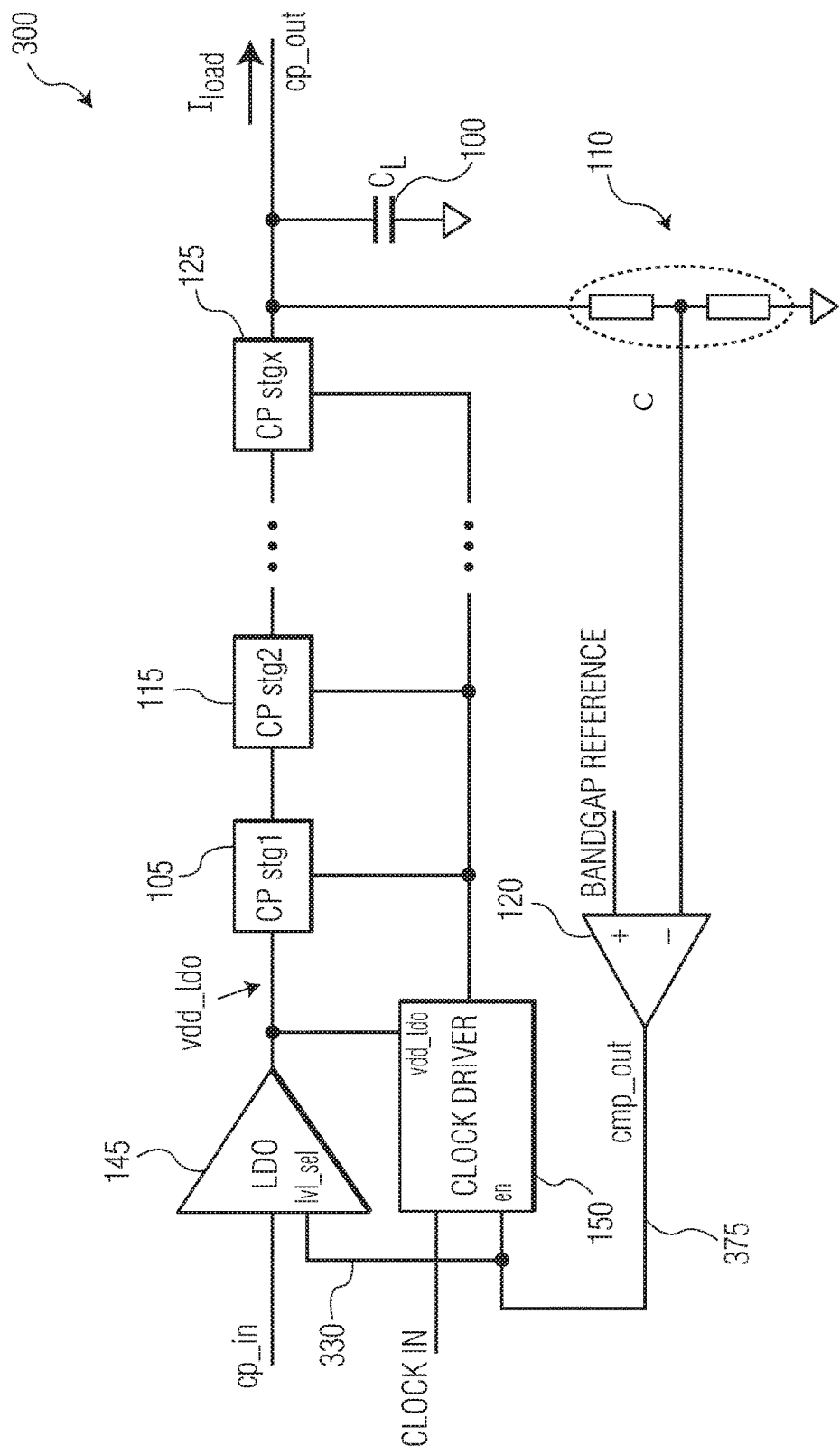
FIG. 3 illustrates another output regulated charge pump in accordance with example embodiments described herein.

FIG. 3 illustrates another output regulated charge pump 300 in accordance with example embodiments described herein. As illustrated in FIG. 1, the LDO regulator 145 may input the low voltage supply cp_in, and may output a plurality of output levels, from "level low" to "level high," based on a feedback received from the loading. FIG. 3 illustrates a dual feedback loop C, in which current sensing information may be derived from the cmp_out signal 375. The loading information may be available from a duty cycle of the feedback comparator 120 output cmp_out signal 375, which may directly select the LDO regulator 145 levels. As described herein, the LDO regulator 145 may regulate the input value of vdd_ldo, and contribute to ripple reduction.

Example embodiments describe how to fix excessive charge injection of the output regulated charge pump 100. The second feedback loop B (illustrated in FIG. 1) and the current level sampled cmp_out signal 375 (illustrated in FIG. 3) that produce the lvl_sel signal may determine pumping statistics. The lvl_sel signal indicates a loading condition of the output from the third charge pump stage 125. The current sensing control circuit 130 and the lvl_sel signal derived from the cmp_out signal 375 measure the load. Higher average value of lvl_sel means that more current is being used by the load of the charge pump, and that the output regulated charge pump 100 is being stressed more. Using the feedback lvl_sel, an output of the charge pump may be decided by its first stage input voltage in addition to the pump driver duty cycle, determined by the first feedback loop. The voltage output from the third charge pump stage 125 is resultant upon the LDO regulator 145 output. If the LDO regulator 145 output is increased, then the voltage output from the third charge pump stage 125 is increased as a result of increased charge injection If the sensed current is low, that means a light load is present, and the third charge pump stage 125 should be configured to pump less. The current sensing feedback may control an input voltage to the output regulated charge pump 100. The input lvl_sel that gets fed back may be a binary indicator, high or low, configured to indicate to the LDO regulator 145 to choose one of a plurality of variations of vdd_ldo as in input to the first charge pump stage 105. Thus the LDO regulator 145 may be considered a variable LDO regulator 145 or an LDO regulator 145 that outputs variable voltages. The LDO regulator 145 may output a variable first output voltage that covers a continuous range from a minimum level to a maximum level. Different duty cycles of different loadings are illustrated in FIGS. 4-6.

In output regulated charge pump 300, the single feedback loop C may be used to obtain two different sets of data, instead of the two feedback loops A and B used in FIG. 1. In FIG. 1, the feedback loop B may be separate from the feedback loop A. The dual feedback loop C may use a fully functional secondary current feedback to reduce the output ripple.

Figure 4:
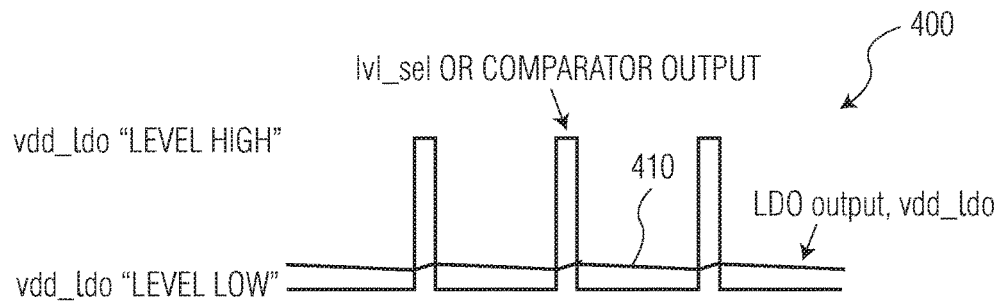
FIG. 4 illustrates input regulation for a light load including a longer duty cycle of feeback comparator output in accordance with example embodiments described herein.
Figure 5:
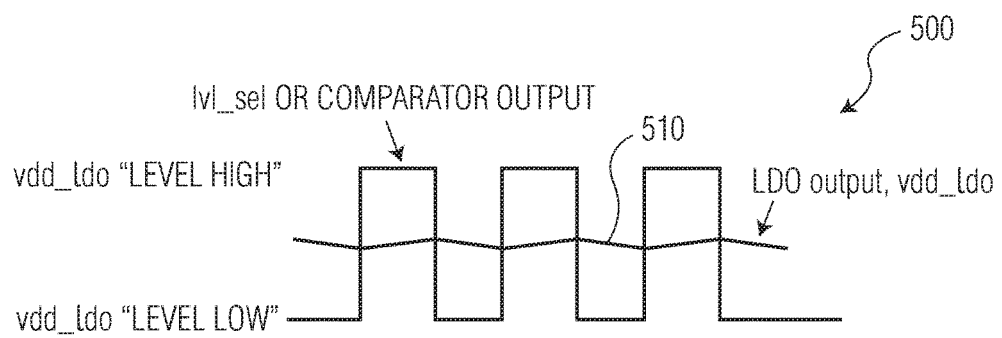
FIG. 5 illustrates input regulation for a medium load including a medium duty cycle of feedback comparator output in accordance with example embodiments described herein.
Figure 6:
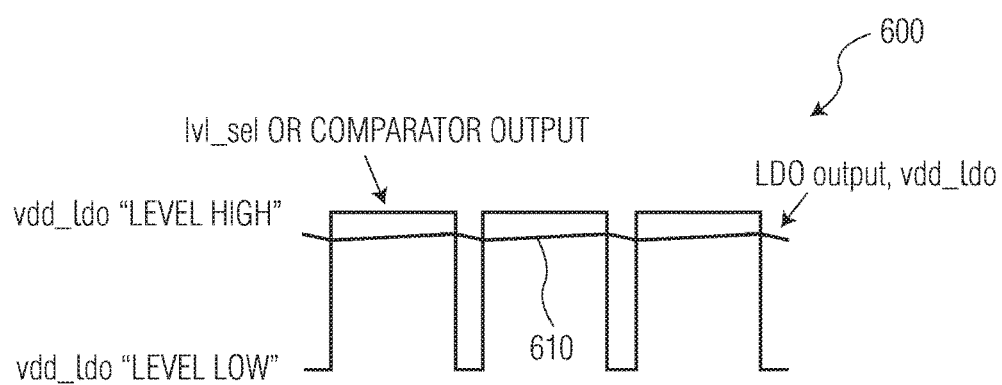
FIG. 6 illustrates input regulation for a heavy load including a longer duty cycle of feeback comparator output in accordance with example embodiments described herein.

FIGS. 4-6 illustrate input and output signals of the LDO regulator 145 for light, medium, and heavy loads in accordance with embodiments described herein. Referring to FIGS. 1, 3, and 4, the LDO regulator 145 may receive a level select signal "lvl_sel" indicating a current load being used by the output regulated charge pump 100. As illustrated in FIG. 1, the level select signal 165 is output from the current sensing control circuit 130. As illustrated in FIG. 3, the level select signal 365 is derived from the comparator our cmp_out signal 375. The level select signals 365 has a duty cycle in which the high value is proportional to the level of load being used by the output regulated charge pump 100. The level select signal 165 could indicate the current level using various methods including the duty cycle. The lvl_sel signal is fed back into the LDO regulator 145, which outputs a vdd_ldo level commensurate with the sensed load level to the first charge pump stage 105. The first charge pump stage 105 thus starts at proper voltage level that allows the subsequent third charge pump stage 125 to output a voltage level that substantially matches a voltage required by the current load. This feedback and matching ability reduces an output ripple, ensures smooth operation, and prevents waste of excess energy in the circuit. As illustrated in FIGS. 4-6 the lvl_sel signals 465, 565, and 665 may be a binary signals having "level low" and "level high" components.

FIG. 4 illustrates input regulation for a light load including a longer duty cycle of feeback comparator output in accordance with example embodiments described herein In FIG. 4, the lvl_sel signal 465 has a short duration "level high" component and a long duration "level low" component. The lvl_sel signal 465 may be input into the LDO regulator 145 and a low LDO output signal vdd_ldo 485 is sent to the first charge pump stage 105. As illustrated in FIG. 4, the vdd_ldo output signal 485 is positioned lower in the graph, indicating the lower magnitude of this signal.

FIG. 5 illustrates input regulation for a medium load including a medium duty cycle of feedback comparator output in accordance with example embodiments described herein. FIG. 5 illustrates that as the output loading increases to medium load, the duty cycle of the feedback comparator 120 increases, as does a medium vdd_ldo voltage signal 585. In FIG. 5, the lvl_sel signal 565 may have substantially same duration "level high" and "level low" signals output from the current sensing control circuit 130 or derived from the cmp_out signal 375. A result from the LDO regulator 145 would be the medium vdd_ldo voltage signal 585. This signal would be commensurate with a medium load at the output of the output regulated charge pump 100.

FIG. 6 illustrates input regulation for a heavy load including a longer duty cycle of feeback comparator output in accordance with example embodiments described herein. FIG. 6 illustrates that as the output loading increases to a heavy load, the duty cycle of the feedback comparator increases further, as does the vdd_ldo average value. In FIG. 6, the lvl_sel signal 665 input to the comparator may have a longer "level high" portion and a shorter "level low" portion for the duty cycle. Input to the LDO regulator 145, this weighted input may result in a high LDO vdd_ldo output signal 685 from the LDO regulator 145. This high LDO vdd_ldo output signal 685 may produce a higher starting point for the first charge pump stage 105 of the output regulated charge pump 100 which may correspond to a larger load sensed by the current sensing control circuit 130 or derived from the cmp_out signal 375 from the feedback comparator 120. Though low, medium, and high output voltages are described and illustrated for vdd_ldo, additional voltage levels between low and high may be determined by the LDO regulator 145 based on varied duty cycle lvl_sel signals received from the current sensing circuitry.

As a result of the variable LDO regulator 145 including feedback circuits, charge injection to a charge pump output may be decreased when desired and a size of an output capacitor may be decreased by a factor of ten or more, reducing an overall size of the circuit. A lower input voltage to the output regulated charge pump 100 may be used to satisfy the loading, and decrease output ripple. The LDO regulator 145 having a changeable output may provide an additional way to control a charge pump, rather than merely using a clock driver.

Other example embodiments may produce similar effects by using an enable signal of a block, which may consume power from the output regulated charge pump 100 output, to select the LDO regulator 145 level, using the charge pump loading condition at a higher system level. In addition, example embodiments could have a fraction of the output current sensed by a high-ratio current mirror as a loading indicator and compare it against pre-set thresholds to select the LDO regulator 145 levels.

Example embodiments may be applied to internet of things (IoT) applications, and interface to products and other applications requiring a supply voltage greater than a chip power supply.

Although the various exemplary embodiments have been described in detail with particular reference to certain exemplary aspects thereof, it should be understood that the invention is capable of other example embodiments and its details are capable of modifications in various obvious respects. As is readily apparent to those skilled in the art, variations and modifications can be affected while remaining within the spirit and scope of the invention. Accordingly, the foregoing disclosure, description, and figures are for illustrative purposes only and do not in any way limit the invention, which is defined only by the claims.

The invention claimed is:

1. An output regulated charge pump, comprising:
   a low drop out (LDO) regulator configured to output a variable first output voltage;
   a multi-stage charge pump configured to receive the variable first output voltage and produce a second output voltage to power a load;
   a first feedback circuit including a comparator and configured to compare the second output voltage to a reference voltage; and
   a second feedback circuit configured to measure a level of current used by the load,
   wherein the second feedback circuit outputs a level select signal to the LDO that is configured to vary a level of the first output voltage; and
   wherein the level select signal is derived from an output signal of the comparator.

2. The charge pump of claim 1,
   wherein the first feedback circuit further includes a voltage divider and a clock driver.

3. The charge pump of claim 2,
   wherein the comparator outputs a signal to control the clock driver.

4. The charge pump of claim 1,
   wherein the multi-stage charge pump includes at least one pumping stage that outputs higher voltage than its input voltage.

5. The charge pump of claim 1,
   wherein the second feedback circuit includes a current sensing circuit separate from the first feedback circuit.

6. The charge pump of claim 1,
   wherein the reference voltage is a bandgap voltage.

7. The charge pump of claim 1,
   wherein the level select signal is a binary signal.

8. The charge pump of claim 1,
   wherein the variable first output voltage has at least three levels.

9. The charge pump of claim 1, wherein the variable first output voltage covers a continuous range from a minimum level to a maximum level.

10. A method of regulating an output of a charge pump, comprising:
    outputting a first voltage level to a first stage of a multi-stage charge pump;
    outputting a second voltage level from an output stage of the multi-stage charge pump to power a load;
    comparing the second voltage level to a reference voltage using a comparator to determine an average value of the second voltage level;
    measuring a current level used by the load using the comparator and inputting a level select signal to an LDO indicative of the current level; and
    using the level select signal in the LDO to output a variable voltage signal to the multi-stage charge pump to control the second voltage level to be a level commensurate with the load;
    wherein the level select signal is derived from an output signal of the comparator.

11. The method of claim 10, further comprising
    using a first feedback loop to conduct the voltage comparing.

12. The method of claim 10, further comprising
    using a second feedback loop to conduct the current sensing.

13. The method of claim 10, further comprising
    deriving the sensed current from a feedback loop that determines a level of the second output voltage.

14. The method of claim 10, further comprising
    dropping down the second voltage level using a voltage divider,
    comparing the dropped down voltage to the reference voltage using the comparator, and
    inputting an output of the compared voltages to a clock driver.

15. The method of claim 14, further comprising
    controlling the clock driver using an output of the comparator.

16. The method of claim 14, further comprising
    deriving the level select signal from an output signal of the comparator.

17. The method of claim 10,
    wherein the reference voltage is a bandgap voltage.

18. The method of claim 10,
    wherein the variable voltage level has at least three levels.

19. The method of claim 10,
    wherein the variable voltage level covers a continuous range from its minimum level to maximum level.

* * * * *